(12) United States Patent
Hwang et al.

(10) Patent No.: US 7,125,757 B2
(45) Date of Patent: Oct. 24, 2006

(54) METHOD OF MANUFACTURING AN ARRAY SUBSTRATE FOR A LIQUID CRYSTAL DISPLAY DEVICE

(75) Inventors: Kwang-Jo Hwang, Gyeonggi-do (KR); Woo-Hyun Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/106,551

(22) Filed: Mar. 27, 2002

(65) Prior Publication Data
US 2002/0142505 A1 Oct. 3, 2002

(30) Foreign Application Priority Data
Mar. 29, 2001 (KR) .............................. 2001-16628

(51) Int. Cl.
*H01L 21/00* (2006.01)
(52) U.S. Cl. ...................................... 438/151; 438/949
(58) Field of Classification Search ................ 257/415, 257/417, 418, 420; 438/30, 708, 725, 942, 438/948, 949, 108, 149, 151; 430/1–967
See application file for complete search history.

(56) References Cited

U.S. PATENT DOCUMENTS

| | | | | |
|---|---|---|---|---|
| 5,427,962 A | * | 6/1995 | Sasaki et al. ................ 438/159 |
| 5,998,229 A | * | 12/1999 | Lyu et al. ..................... 438/30 |
| 6,094,248 A | * | 7/2000 | Hayashi | |
| 6,204,081 B1 | * | 3/2001 | Kim et al. ..................... 438/30 |
| 6,255,130 B1 | * | 7/2001 | Kim ............................. 438/30 |
| 6,335,148 B1 | * | 1/2002 | Lee et al. .................... 430/316 |
| 6,376,271 B1 | * | 4/2002 | Sawayama et al. ........... 438/30 |
| 6,537,840 B1 | * | 3/2003 | Tseng .......................... 438/30 |
| 6,566,180 B1 | * | 5/2003 | Park et al. .................. 438/166 |
| 6,746,887 B1 | * | 6/2004 | Moon et al. .................. 438/30 |
| 2002/0033927 A1 | * | 3/2002 | Mun et al. | |

FOREIGN PATENT DOCUMENTS

| | | |
|---|---|---|
| KR | 1020000027714 | 5/2000 |
| KR | 1020010017529 | 3/2001 |

OTHER PUBLICATIONS

Stanley Wolf and Richard N. Tauber, Silicon Processing for The VLSI Era, Lattice Press, vol. I, 407-409 and 416.*

* cited by examiner

*Primary Examiner*—Lynne A. Gurley
*Assistant Examiner*—Stanetta Isaac
(74) *Attorney, Agent, or Firm*—Birch, Stewart, Kolasch &Birch, LLP (57) ABSTRACT

An advantage of the present invention is to provide a method of manufacturing an array substrate for a liquid crystal display device in which a mask that has double slits in it is used in the photolithographic masking process for the pixel electrode to reduce the distance between a pixel electrode and a neighboring pixel electrode and thus reduce the width of a data line, which results in an improvement of the aperture ratio.

18 Claims, 12 Drawing Sheets

METHOD OF MANUFACTURING AN ARRAY SUBSTRATE FOR A LIQUID CRYSTAL DISPLAY DEVICE

BACKGROUND OF THE INVENTION

This application claims the benefit of Korean Patent Application No. 2001-16628, filed on Mar. 29, 2001 in Korea, which is hereby incorporated by reference for all purposes as if fully set forth herein.

FIELD OF THE INVENTION

The present invention relates to a liquid crystal display (LCD) device and more particularly, to a manufacturing method of an array substrate for a liquid crystal display device.

DISCUSSION OF THE RELATED ART

Flat panel display devices, which have properties of being thin, low weight and low power consumption, have been required as the information age rapidly evolves. The liquid crystal display device is widely used for notebook computers and desktop monitors, etc. because of its superior resolution, color image display and quality of displayed images. The liquid crystal display device displays images using an optical anisotropy of liquid crystal and consists of an upper substrate, a lower substrate and liquid crystal disposed between the upper and lower substrates.

Figure 1:
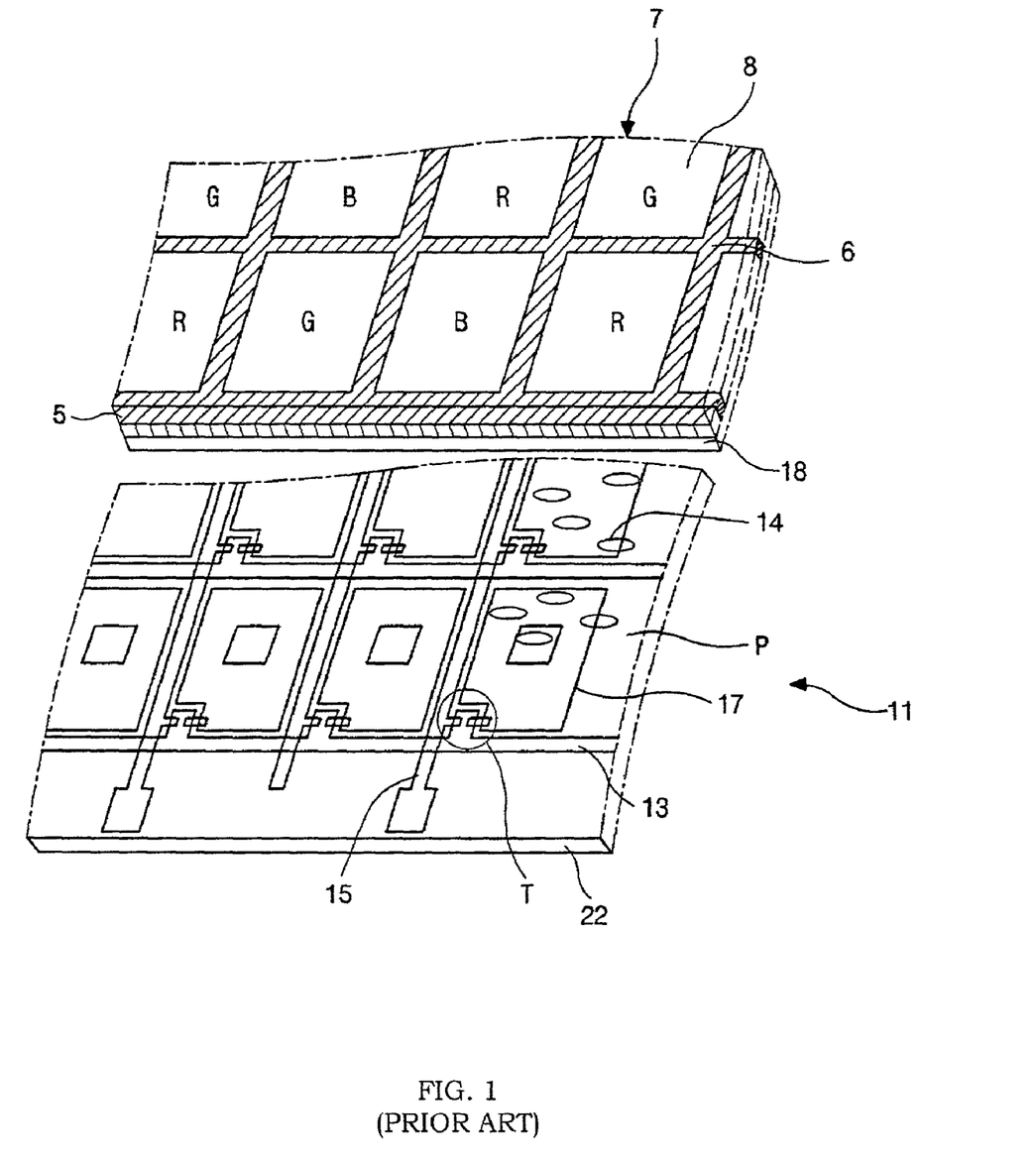
FIG. 1 is an exploded perspective view illustrating a conventional color liquid crystal display device.

FIG. 1 is an exploded perspective view illustrating a conventional color liquid crystal display device 11. As shown in the figure, the upper substrate 5 includes a color filter 7 and a transparent common electrode 18. The color filter 7 includes a black matrix 6 and sub-color-filters R, G, and B 8. The lower substrate 22 includes a pixel region "P", a pixel electrode 17 in the pixel region and an array line including a switching element "T". The liquid crystal 14 is interposed between the upper substrate 5 and the lower substrate 22. The lower substrate 22 is referred to as an array substrate. A plurality of gate lines 13 and a plurality of data lines 15 cross each other defining the pixel region "P" and a plurality of thin film transistors "T", i.e., a switching element, are formed at the crossing of the gate lines 13 and the data lines 15. The pixel electrode 17 in the pixel region "P" is formed of transparent conductive material such as indium tin oxide (ITO) that has a high transmittance.

The liquid crystal 14 is aligned by a signal that is applied from the thin film transistor "T" and the amount of light that transmits the liquid crystal 14 is controlled according to the alignment of the liquid crystal to display images. One of the important problems that must be overcome in the conventional liquid crystal display device is to obtain a high aperture ratio in order to display images more clearly and brightly. The main factor that affects the aperture ratio is the data line in the liquid crystal display device that has an array structure as described above.

Figure 2:
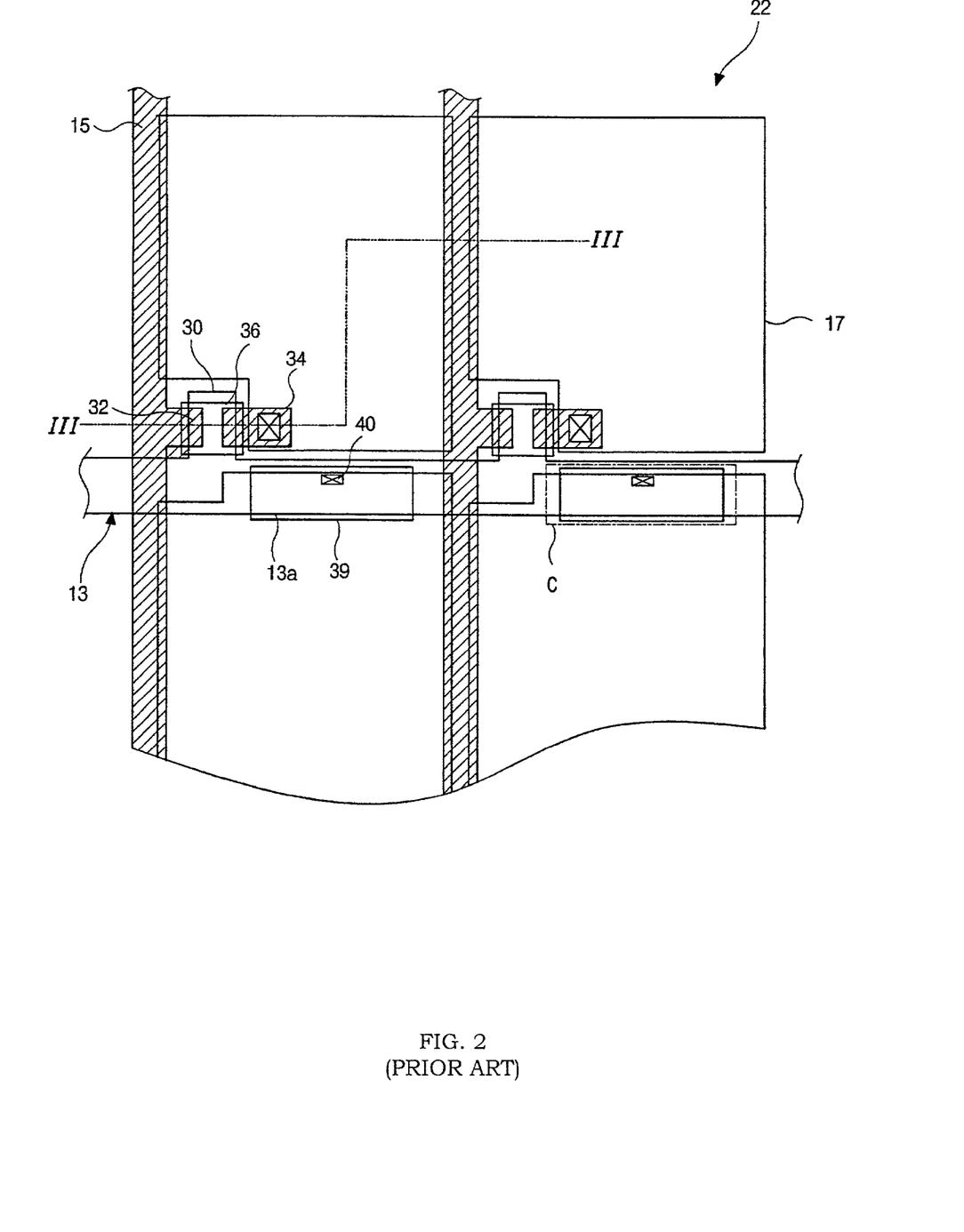
FIG. 2 is a plan view illustrating a partial array substrate for a conventional liquid crystal display device.

The relationship between the data line and the pixel region will be described with reference to FIG. 2. FIG. 2 is a plan view illustrating a partial array substrate for a conventional liquid crystal display device. As shown in the figure, the plurality of gate lines 13 and the plurality of data lines 15 cross each other defining the pixel region "P" on the array substrate 22 and the plurality of thin film transistors "T", which include a gate electrode 30, a source electrode 32, a drain electrode 34 and an active layer 36, are formed at a crossing of the gate lines 13 and the data lines 15. A pixel electrode 17, which contacts the drain electrode 30, is formed over the pixel region "P" and a storage capacitor "C", which forms a parallel circuit with the pixel electrode 17, is formed over the gate line 13. The storage capacitor "C" consists of a first storage electrode 13a, which is a part of the gate line 13, and a second storage electrode 39, which is formed in an island shape with the same material as the source and drain electrodes 32 and 34. The second storage electrode 39 contacts the pixel electrode 17 through the storage contact hole 40.

An aperture ratio of a liquid crystal panel in the structure of the array substrate 22 which was described above increases as the area of the pixel region "P" increases. A reduction of a width of the data line 15 may be considered as one of the methods for enlarging the pixel region "P" and the distance between the pixel electrode and the neighboring pixel electrode must be reduced to narrow the width of the data line 15. However, there exists a limitation in reducing the distance between the pixel electrode 17 and the neighboring pixel electrode 17 under 4 µm when a conventional mask for a light exposure process is used.

A manufacturing process of the array substrate for a conventional liquid crystal display device will be described hereinafter with reference to FIGS. 3A to 3F. FIGS. 3A to 3F are cross-sectional views taken along line III—III of FIG. 2 and illustrate a manufacturing process of an array substrate for a liquid crystal display device according to the prior art. The storage capacitor of storage on a gate type will be noted here as an example. An inverted staggered type thin film transistor is generally used for a general liquid crystal display device because of its simple structure and good performance. The inverted staggered type thin film transistor can be classified into a back channel etch (BCE) type and an etch stopper (ES) type according to the channel forming method. The back channel etch type thin film transistor will be taken here for description.

First, a glass substrate goes through a cleaning process to remove contaminations or organic material from the substrate and to increase an adhesive property between a metal thin film for the gate material and the glass substrate.

Figure 3A:
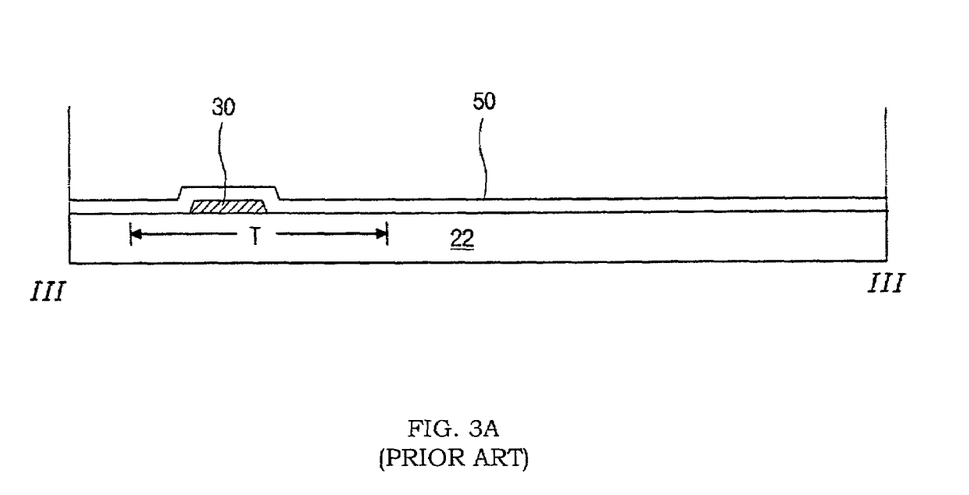
FIGS. 3A to 3F are cross-sectional views taken along line III—III of FIG. 2 and illustrating a manufacturing process of an array substrate for a liquid crystal display device according to the prior art.

In FIG. 3A, a gate electrode 30 and a gate line 13 of FIG. 2 are formed on the substrate 22 by depositing metal material and patterning it using a first mask. A part of the gate line 13 of FIG. 2 is used as the first storage electrode 13a of FIG. 2. Aluminum (Al), which has a low resistance, is usually selected for the gate electrode material to reduce RC-delay. However, because pure aluminum (Al) has a low corrosion-resistance to chemicals and causes a defective line due to the hillock formation in a later high temperature process, an aluminum alloy is used instead of the pure aluminum or other materials such as aluminum neodymium (AlNd), molybdenum (Mo), for example, can be formed on the pure aluminum (Al) to prevent the hillock formation. The gate electrode 30 and the first storage electrode 13a extend from the gate line and are respectively referred to as the gate electrode 30 and the first storage electrode 13a, considering their function. A gate insulating layer 50 is formed on the substrate 22 by depositing or coating thereon, inorganic insulating material such as for example, silicon oxide ($SiO_2$) and silicon nitride ($SiN_X$), or an organic insulating material such as for example, benzocyclobutene (BCB) and an acrylic resin.

Figure 3B:
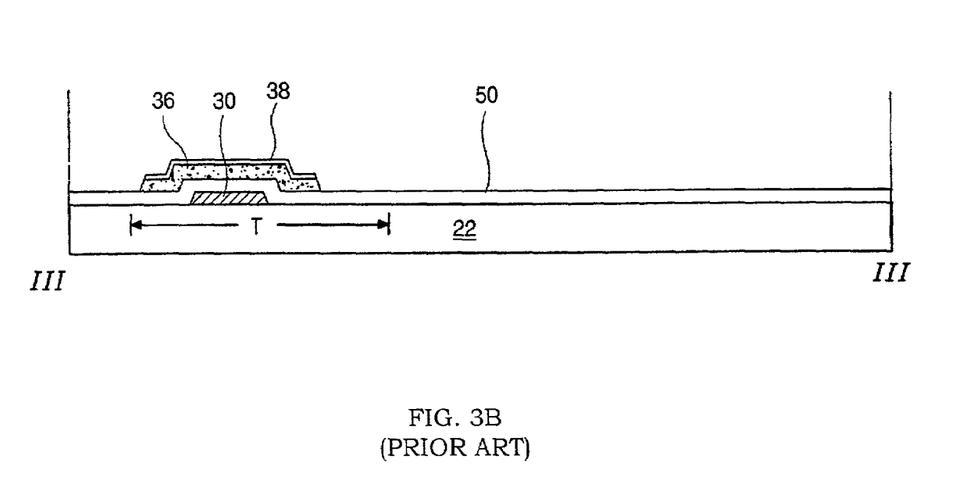

In FIG. 3B, amorphous silicon (a-Si:H) and doped amorphous silicon are deposited on the gate insulating layer 50 to form a semiconductor layer. An active layer 36 and an ohmic contact layer 38 are formed by patterning the semi-conductor layer using a second mask. The ohmic contact layer 38 is provided for reducing the contact resistance between the active layer 36 and a metal layer that is to be formed in subsequent processing.

Figure 3C:
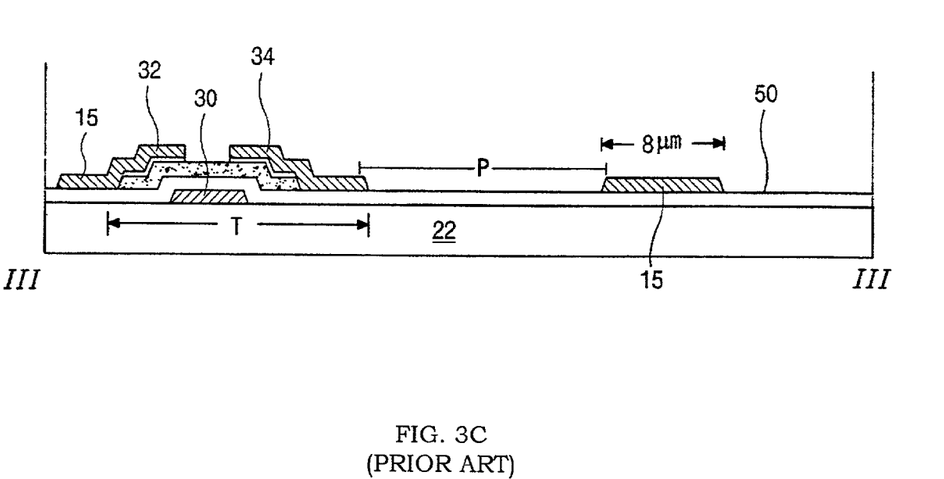

In FIG. 3C, the data line 15, the source electrode 32, the drain electrode 34 and the second storage electrode 39 of FIG. 2 are formed by depositing conductive metal material such as for example, chromium (Cr), molybdenum (Mo), tungsten (W), antimony (Sb) and tantalum (Ta), on the whole substrate and patterning it using a third mask. The drain electrode 34 is spaced apart from the source electrode 32. The data line 15 is patterned to have a minimum width of 8 μm as shown in the figure. Because a minimum distance between the pixel electrode and the neighboring pixel electrode, which will be formed over the data line 15 in later processing, is 4 μm, and at least 2 μm of both sides of the data line 15 should be overlapped with the pixel electrodes, the minimum width of the data line 15 is 8 μm according to the prior art.

Figure 3D:
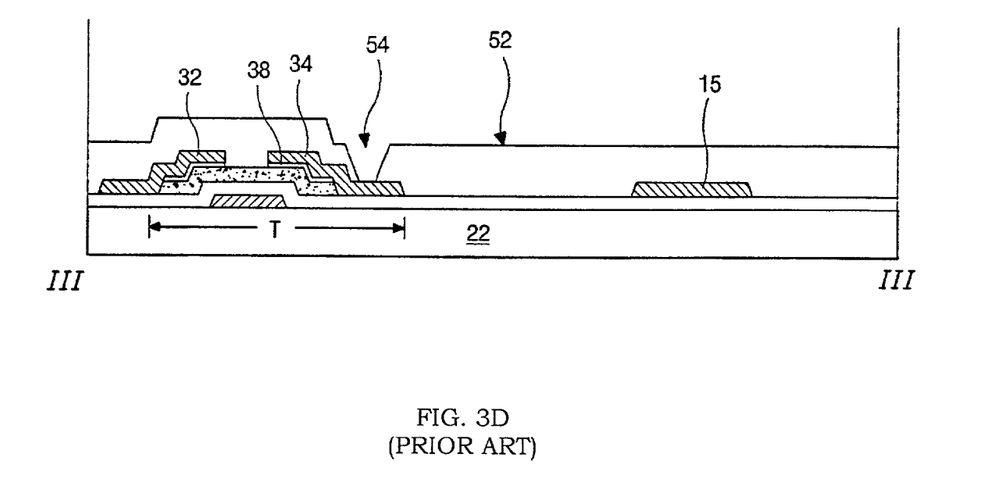

In FIG. 3D, a passivation layer 52 is subsequently formed by depositing or coating a transparent organic insulating material such as benzocyclobutene (BCB) or an acrylic resin on the entire substrate. A drain contact hole 54, which exposes a part of the drain electrode 34, and the storage contact hole 40 of FIG. 2, which exposes a part of the second storage electrode 39, are formed by patterning the passivation layer 52 using a fourth mask.

Figure 3E:
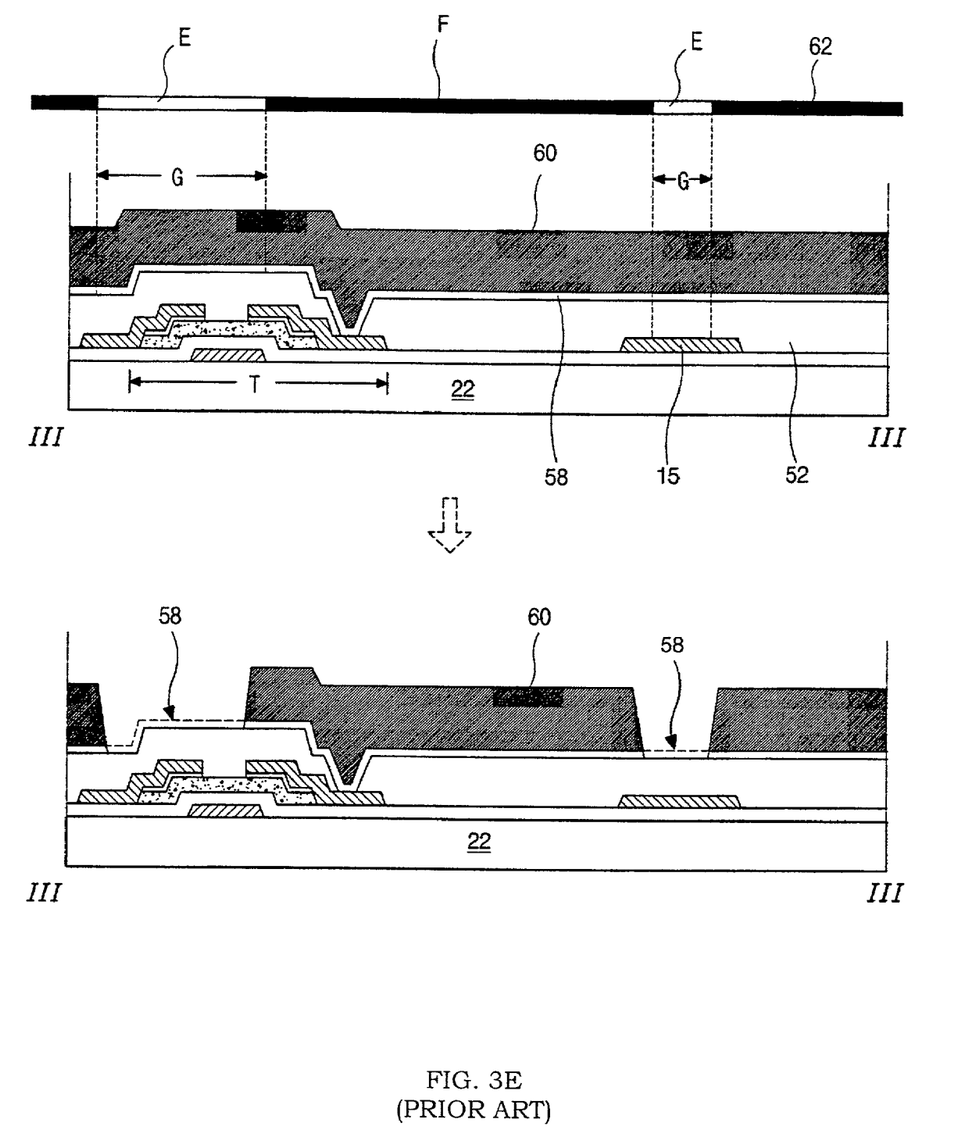

In FIG. 3E, a transparent conductive metal layer 58 is formed on the passivation layer 52 by depositing a transparent conductive metal material such as for example, indium tin oxide (ITO) or indium zinc oxide (IZO), on the passivation layer 52. A photo-resist layer 60 is formed on the transparent conductive metal layer 58. A fifth mask 62, which consists of a light transmission portion "E" and a light blocking portion "F", is disposed over the photo-resist layer 60 and then a light exposure is performed. The photo-resist layer portion that corresponds to the data line 15, the gate line (not shown) and the thin film transistor "T" is exposed to light as shown in figure as "G" and the exposed portion of the photo-resist layer 60 is removed using a developer. The transparent conductive metal layer 58, which corresponds to the removed portion of the photo-resist layer 60, is etched away.

Figure 3F:
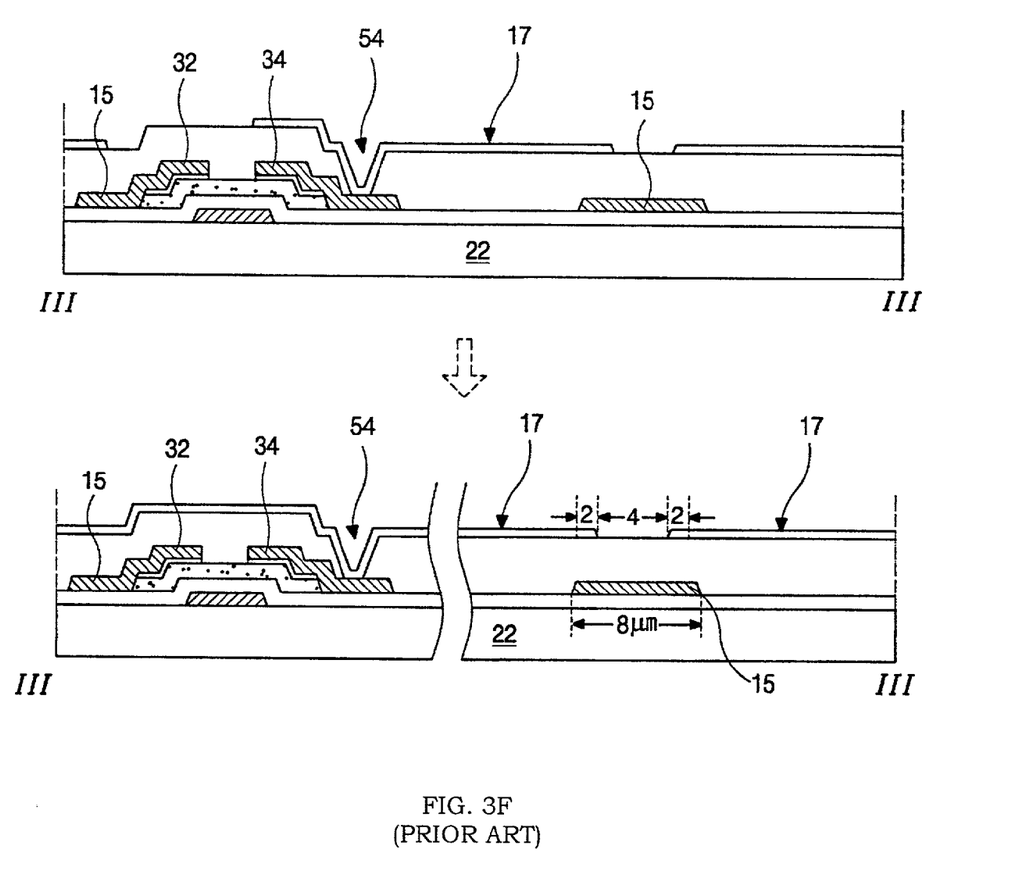

The pixel electrode 17 is formed through the above process as shown in FIG. 3F. The pixel electrode 17 contacts the drain electrode 34 through the drain contact hole 54 and contacts the second storage electrode 39 of FIG. 2 through the storage contact hole 40 of FIG. 2. A length of 2 μm of the pixel electrode 17 is overlapped with the data line at both sides of the data line 15 and the distance between the respective pixel electrodes 17 is 4 μm as shown in the figure. The distance between the respective pixel electrodes 17 can be formed to have a minimum value on the condition that the pixel electrode 17 and the neighboring pixel electrode 17 do not electrically affect each other. Generally, the minimum distance that satisfies the above condition is known to be 2 μm. Accordingly, if the distance between the pixel electrode 17 and the neighboring pixel electrode 17 can be minimized to 2 μm, the width of the data line 15 can be reduced that much. Therefore, the aperture ratio can be improved due to a reduction of the data line width that occupies a non-driving area of the liquid crystal panel.

Figure 4:
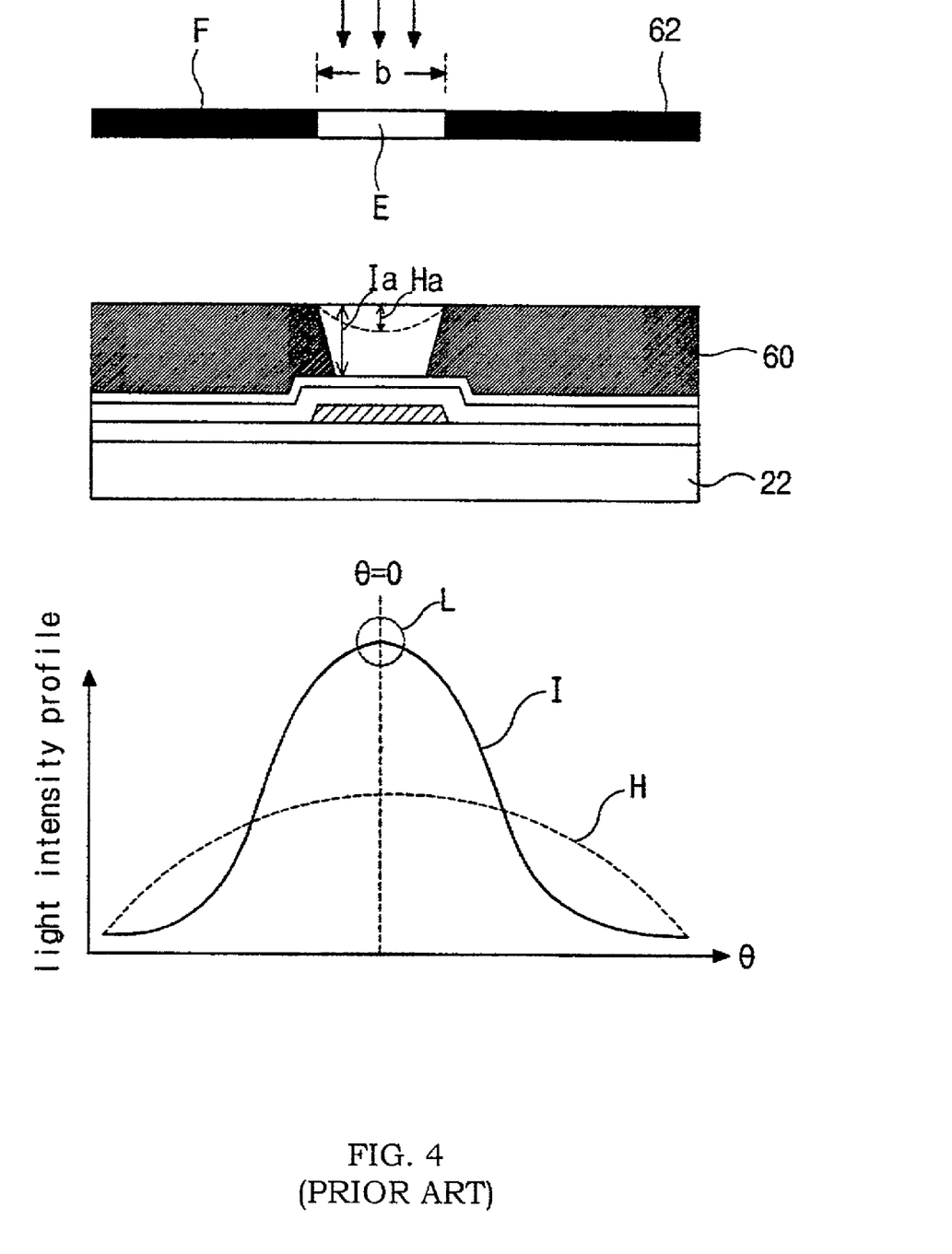
FIG. 4 is a view illustrating a structure of a mask slit and a light intensity profile that results from the mask structure according to the prior art.

However, the distance between the pixel electrode 17 and the neighboring pixel electrode 17 cannot be narrowed under 4 μm when a conventional light exposure method is used. The reason for this will be described in detail hereinafter with reference to FIG. 4. FIG. 4 is a view illustrating the structure of a mask slit and a light intensity profile that results from the mask structure according to the prior art. When light is transmitted through the light transmission portion "E" of the mask 62, which has a single slit, the light is diffracted by the Fraunhofer diffraction effect and a light intensity distribution of the light reaches the substrate 22. At this time, a width of the light intensity distribution is in inverse proportion to a width "b" of the light transmission portion "E" of the mask 62 but is in proportion to a wavelength λ of the light. The brightest light intensity "L" appears in a region corresponding to the middle of the light transmission portion "E" of the mask 62 and the light intensity is in proportion to the width "b" of the light transmission portion "E" of the mask 62. The light intensity of the diffracted light through the light transmission portion "E" of the mask 62 can be numerically expressed as follows;

$$I = I_o (\sin \beta / \beta)^2,$$

where $\beta = (1/2)kb \sin \theta$, in which $\sin \theta = 2\pi/kb = \lambda/b$, where k is a propagation constant, I is the light intensity, λ is the wavelength of light, b is the width of the light transmission portion of the mask and θ is the diffraction angle to the light progressive direction. As it can be seen from the above numerical expression, the photo-resist layer 60 can be exposed to light completely only by reducing the diffraction angle θ to reduce the width of the light intensity distribution. If the width "b" of the light transmission portion "E" is enlarged when the wavelength λ is maintained constant, the width of a light intensity profile "I" is narrowed and thus a complete light exposure "Ia" can be achieved. On the other hand, if the width "b" of the light transmission portion "E" is narrowed when the wavelength λ is maintained constant, only an upper part "Ha" of the photoresist layer 60 is exposed to light because the diffraction angle θ is increased and thus the width of the light intensity profile "H" is enlarged resulting in a weakness of the light intensity. In both cases, because the light intensity diminishes rapidly from a point where the diffraction angle θ is zero and thus the amount of the light for light exposure becomes insufficient, the light exposure state of the photo-resist layer 60 becomes irregular. Accordingly, when the single slit mask is used, the width "b" of the light transmission portion "E" of the mask 62 should be decided, to expose the photo-resist layer 60 to light uniformly. Therefore, there exists a limitation in reducing the width of the light transmission portion "E" of the mask 62 and consequently there exists a limitation also in reducing the distance between the pixel electrode and the neighboring pixel electrode.

When the relationship between the width of the light transmission portion "b" of the mask 62 and the light intensity distribution for the light exposure process is considered, the minimum distance between the pixel electrode 17 and the neighboring pixel electrode 17 that can be achieved by the conventional photolithographic masking process is 4 μm. Accordingly, when considering the minimum distance of 4 μm between the pixel electrode 17 and the neighboring pixel electrode 17 and two overlaid widths of 2 μm between the pixel electrode 17 and the data line 15 at both sides of the data line 15, the data line 15 should be patterned to have a minimum width of 8 μm according to the prior art. Because there is a limitation in the reduction of the width of the data line 15 as described above, it is difficult to improve the aperture ratio more than that.

SUMMARY OF THE INVENTION

Accordingly, the present invention is directed to a manufacturing method of an array substrate for a liquid crystal display device that substantially obviates one or more of problems due to limitations and disadvantages of the related art.

An advantage of the present invention is to provide a method of manufacturing an array substrate for a liquid crystal display device in which a mask that has double slits in it is used in the photolithographic masking process for the pixel electrode to reduce the distance between a pixel electrode and a neighboring pixel electrode and thus reduce the width of a data line, which results in an improvement of the aperture ratio.

Additional features and advantages of the present invention will be set forth in the description which follows, and in part will be apparent from the description, or may be learned by the practice of the present invention. The objectives and other advantages of the present invention will be realized and attained by the structure particularly pointed out in the written description and claims hereof as well as the appended drawings.

To achieve these and other advantages and in accordance with the purpose of the present invention, as embodied and broadly described, a manufacturing method of an array substrate for a liquid crystal display device comprises the steps of forming a gate line and a gate electrode on a substrate, forming a gate insulating layer on the substrate, forming an active layer and an ohmic contact layer on the gate insulating layer, forming a data line, a source electrode and a drain electrode on the substrate, forming a passivation layer by depositing insulating material on the substrate, forming a drain contact hole by patterning the passivation layer, the drain contact hole exposing a part of the drain electrode, forming a transparent metal layer on the passivation layer, forming a photo-resist layer on the transparent metal layer, performing a light exposure process by disposing a mask over the photo-resist layer, the mask including a light blocking portion, a slit portion and a light transmission portion, and forming a pixel electrode by developing the photo-resist layer exposed to light and etching an exposed transparent metal layer. The light blocking portion of the mask corresponds to the pixel electrode region, the light transmission portion of the mask corresponds to the thin film transistor and the slit portion corresponds to the data line. The distance between the pixel electrode and the neighboring pixel electrode is 2 to 3.5 μm. An overlapped width between the pixel electrode and one side of the data line is 2 μm. The width of the data line is 6 to 7.5 μm. The slit portion has at least two slits. The width of the slit is 1.2 μm and the distance between the slits is 0.5 μm.

In another aspect, a manufacturing method of a thin film transistor array substrate for a display device includes the steps of forming a plurality of gate lines and a plurality of gate electrodes on a substrate by depositing and etching a first conductive layer; forming a gate insulating layer on the substrate to cover the plurality of gate lines and the plurality of gate electrodes; forming a plurality of island-shaped active layers and a plurality of island-shaped ohmic contact layers on the gate insulating layer; forming a plurality of data lines, a plurality of source electrodes and a plurality of drain electrodes on the gate insulating layer, the plurality of active layers and the plurality of ohmic contact layers by depositing and etching a second conductive layer; forming a passivation layer having a plurality of contact holes for exposing at least one of the conductive layers by depositing and etching the insulating material on the gate insulating layer to cover the plurality of data lines, the plurality of source electrodes and the plurality of drain electrodes; and forming a plurality of pixel electrodes overlapping with the plurality of data lines and having a space less than 3.5 μm between at least two neighboring pixel electrodes on the passivation layer. The distance between the pixel electrode and the neighboring pixel electrode is 2 to 3.5 μm. The width of the data line is 6 to 7.5 μm. The plurality of pixel electrodes is formed to utilize a mask including a light blocking portion, a slit portion and a light transmission portion. The light blocking portion of the mask corresponds to the pixel electrode, the light transmission portion of the mask corresponds to the active layer, the source electrode and the drain electrode and the slit portion corresponds to the data line. The slit portion has at least two slits. The width of the slit is 1.2 μm and a distance between the slits is 0.5 μm.

It is to be understood that both the foregoing general description and the following detailed description are exemplary and explanatory and are intended to provide further explanation of the present invention as claimed.

BRIEF DESCRIPTION OF THE DRAWINGS

The accompanying drawings, which are included to provide a further understanding of the present invention and are incorporated in and constitute a part of this specification, illustrate embodiments of the invention and together with the description serve to explain the principles of the present invention, and wherein.

DETAILED DESCRIPTION OF THE INVENTION

Reference will now be made in detail to the illustrated embodiments of the present invention, as shown in the accompanying drawings.

Figure 5:
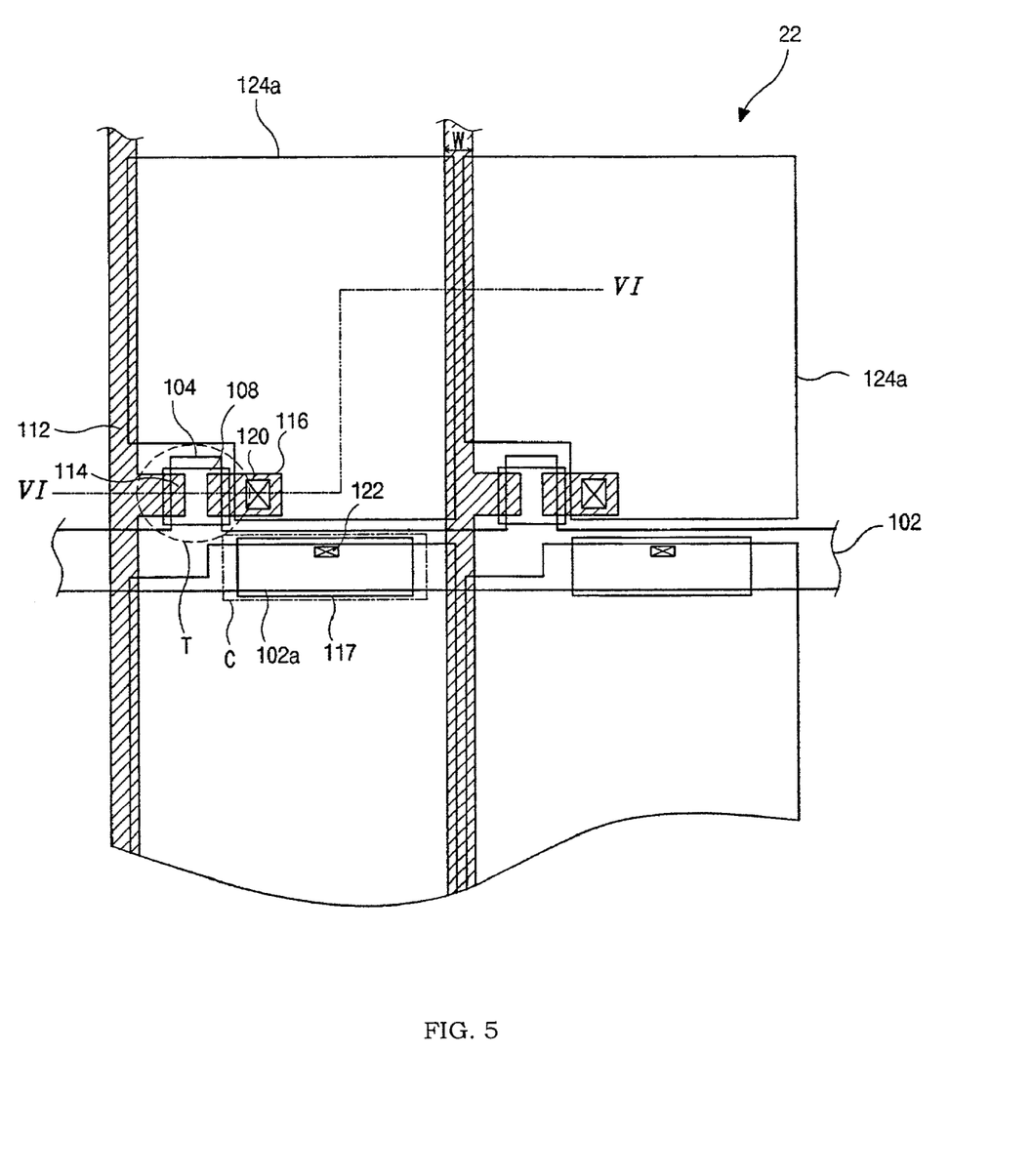
FIG. 5 is a plan view illustrating a partial array substrate for a liquid crystal display device according to the present invention.

FIG. 5 is a plan view illustrating a partial array substrate for a liquid crystal display device according to the present invention. As shown in the figure, a plurality of gate lines 102 and a plurality of data lines 112 cross each other defining a pixel region. A thin film transistor, i.e., a switching element, which consists of a gate electrode 104, a source electrode 114, a drain electrode 116 and an active layer 108, is formed at a region adjacent to the crossing of the gate line 102 and the data line 112. A pixel electrode 124a, which contacts the drain electrode, is formed in the pixel region. A storage capacitor "C", which is electrically connected into the pixel electrode in parallel, is formed over the gate lines 102. The storage capacitor "C" consists of a first storage electrode 102a and a second storage electrode 117.

The liquid crystal display device according to the present invention provides a smaller width "w" of the data line 112 and thus the area of the pixel electrode 124a in the pixel region is increased to improve the aperture ratio.

FIGS. 6A to 6F are cross-sectional views taken along line VI—VI of FIG. 5 and illustrate a manufacturing process of an array substrate for a liquid crystal display device according to the present invention.

Figure 6A:
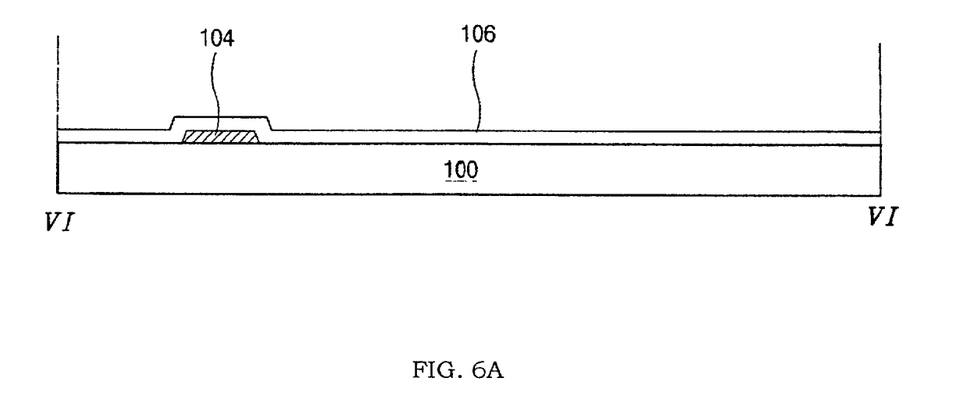
FIGS. 6A to 6F are cross-sectional views taken along line VI—VI of FIG. 5 and illustrating a manufacturing process of an array substrate for a liquid crystal display device according to the present invention.

FIG. 6A illustrates a structure of an array substrate that is manufactured using a first mask. In FIG. 6A, a gate line 102 of FIG. 5 and a gate electrode 104 are formed on a substrate 100 by depositing conductive metal material on the substrate 100 and patterning it using the first mask. In FIG. 5 and 6A, the gate electrode 104 is formed by extending the gate line 102 but the gate electrode 104 may alternatively be defined as a part of the gate line 102. A part of the gate line 102 serves as a first storage electrode 102a of FIG. 5. The conductive metal material for the gate line 102 and the gate electrode 104 may be selected from the group consisting of chromium (Cr), molybdenum (Mo), tantalum (Ta), antimony (Sb) and copper (Cu) and an Aluminum (Al) based metal material such as a pure aluminum or aluminum-neodymium (AlNd) may also be used for the metal material. If the aluminum (Al) based metal material is used for the gate line 102, the RC-delay of a signal in the gate line 102 can be reduced because the aluminum (Al) based metal material has a low electrical resistance. However, because the aluminum (Al) based metal material has a low corrosion-resistance to chemicals, the breaking of the line may occur by the etching solution during the etching process. Accordingly, material that has a high corrosion-resistance to chemicals such as molybdenum (Mo) may be layered on the aluminum (Al) based metal material such as pure aluminum (Al) or the aluminum-neodymium (AlNd). The gate insulating layer 106 is formed on the substrate 100 by depositing or coating with an inorganic insulating material such as for example, silicon oxide ($SiO_2$) and silicon nitride ($SiN_x$), or an organic insulating material such as for example, benzocyclobutene (BCB) and an acrylic resin, on the substrate 100.

Figure 6B:
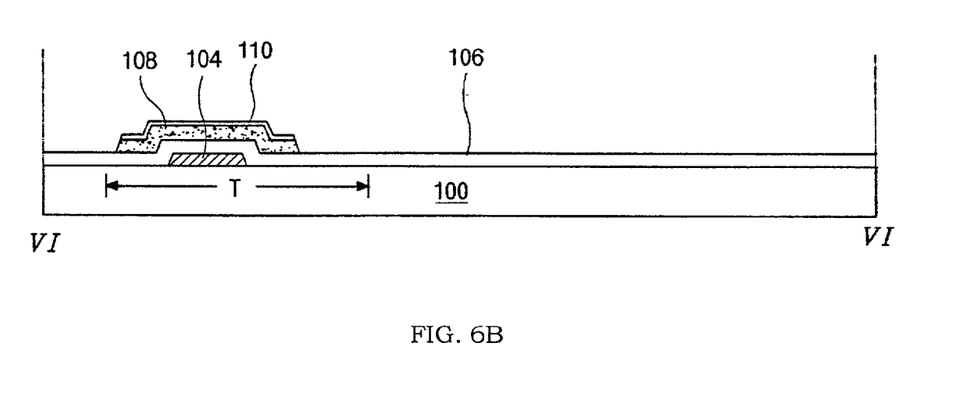

FIG. 6B illustrates the structure of the array substrate that is manufactured using a second mask. An active layer 108 and an ohmic contact layer 110 are formed on the insulating layer 106 by depositing thereon an amorphous silicon layer (a-Si:H) and then a doped amorphous silicon layer (N+a-Si:H) on the insulating layer 106 and patterning it.

Figure 6C:
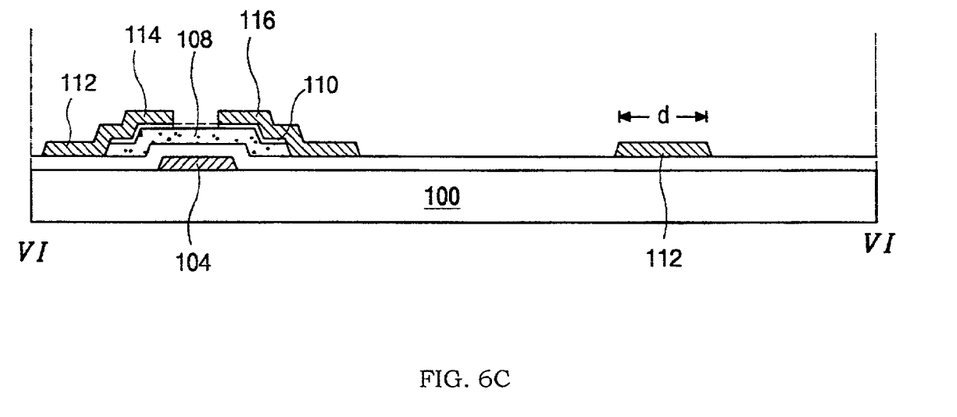

FIG. 6C illustrates the structure of an array substrate that is manufactured using a third mask. The data line 112, the source electrode 114, the drain electrode 116 and the second storage electrode 117 of FIG. 5 are formed on the substrate 100 by depositing conductive metal material such as for example, chromium (Cr), molybdenum (Mo), tantalum (Ta), antimony (Sb), copper (Cu), and an aluminum (Al) based metal material such as a pure aluminum or aluminum-neodymium (AlNd), on the substrate 100 and patterning it. The drain electrode 116 is spaced apart from the gate electrode 114. The second storage electrode 117 of FIG. 5 is formed over the first storage electrode 102a of FIG. 5. The ohmic contact layer 110 is provided for reducing the contact resistance between the active layer 108 and the source and drain electrodes 114 and 116. The portion of the ohmic contact layer 110 between the source and drain electrodes 114 and 116 is etched away to reduce the leakage of electrical current. At this time, the data line 112 is patterned to have a width "d", which is 6 to 7.5 µm.

Figure 6D:
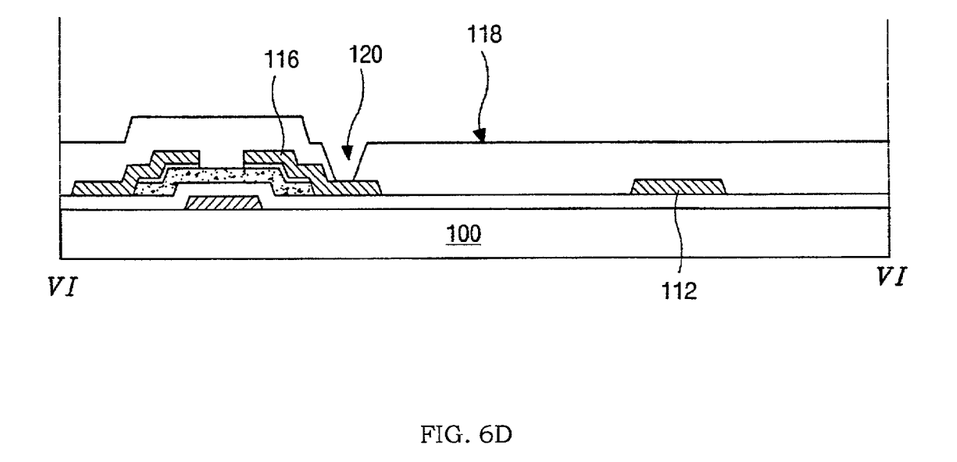

FIG. 6D illustrates the structure of an array substrate that is manufactured using a fourth mask. A passivation layer 118, i.e., a second insulating layer, is formed on the substrate 100 by depositing or coating with an organic insulating material such as for example, benzocyclobutene (BCB) or acrylic resin, on the entire substrate 100. A drain contact hole 120, which exposes a part of the drain electrode 116 through the passivation layer 118, and a storage contact hole 122 of FIG. 5, which exposes a part of the second storage electrode 117 of FIG. 5 through the passivation layer 118, are formed in the passivation layer 118 by patterning the passivation layer 118 in a photolithographic masking process.

Figure 6E:
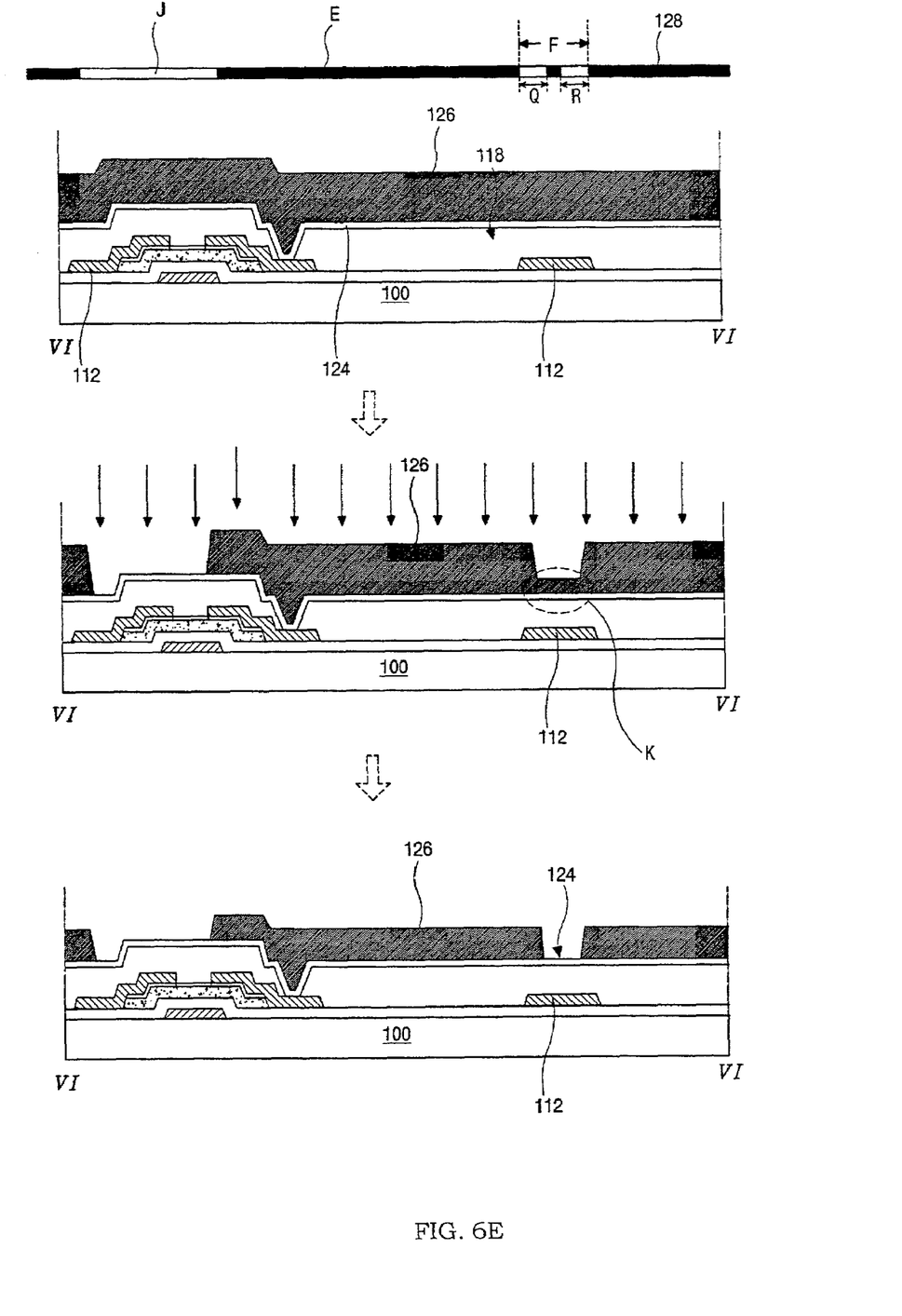

FIG. 6E illustrates a structure of an array substrate that is manufactured using a fifth mask. A transparent conductive metal layer 124 is formed on the passivation layer 118 by depositing transparent conductive metal material such as for example, indium tin oxide (ITO), indium zinc oxide (IZO) and indium tin zinc oxide (ITZO), on the passivation layer 118. A photo-resist layer 126 is formed on the transparent conductive metal layer 124. A fifth mask 128, which consists of a light transmission portion "J", a light blocking portion "E" and a double slit portion "F", is disposed over the photo-resist layer 126 and then a light exposure is conducted. The light blocking portion "E" corresponds to a pixel electrode 124a which will be formed in a subsequent process and the double slit portion "F" corresponds to an opening between the pixel electrode 124a and the neighboring pixel electrode 124a over the data line 112. The light transmission portion "J" corresponds to an opening between the pixel electrode 124a and the neighboring pixel electrode 124a over the gate line 102 and the thin film transistor region. The width of the first slit "Q" and the width of the second slit "R" of the double slit portion "F" of the mask 128 are respectively 1.2 µm and the distance between the first slit "Q" and the second slit "R" is about 0.5 µm. If the mask 128, which has a structure as described above, is used for patterning the pixel electrode 124a, the size of the exposed photo-resist layer portion can be decreased to a greater extent when compared with the prior art.

Figure 7:
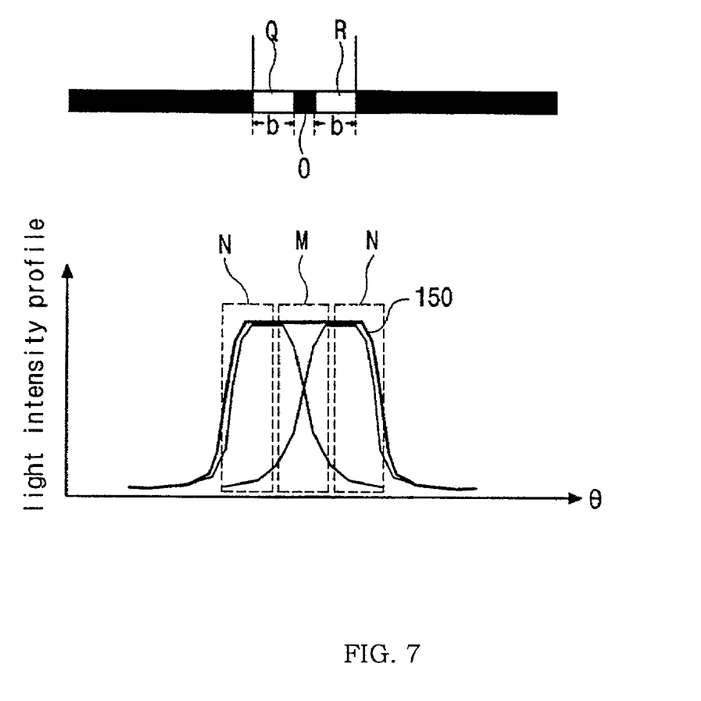
FIG. 7 is a view illustrating a structure of a mask slit and a light intensity profile that results from the mask structure according to the present invention.

When the mask 128 is disposed over the photo-resist layer 126 and then the photolithographic masking process is performed, a light intensity profile of the light, which passes through the double slit portion "F" of the mask 128 and reaches the substrate 100, can be obtained as shown in FIG. 7. Because the lights, which pass through each of the slits respectively and then reaches the substrate 100, overlap with each other as the width "b" of the slits "Q" and "R" becomes narrower, the light intensity "N" of the light, which passes through a middle of each slit "Q" and "R" and the light intensity "M" of the light, which corresponds to the region "O" between the slit "Q" and the slit "R", are substantially equal. Accordingly, though the light intensity of the light, which passes through the narrowed slit of the double slit mask, becomes a little weaker than the conventional single slit mask, a minute patterning can be performed uniformly with a uniform light intensity.

In FIG. 6E, when a development process is subsequently performed after the light exposure process, there remains a residual photoresist layer "K" over the data line 112. The residual photo-resist layer "K" may be etched away by an ashing method, which is one of a dry-etching method. The residual photo-resist layer "K" can be removed completely using the ashing method, and at this time, the photo-resist layer 126 in other regions may also be etched a little but this does not affect the metal layer thereunder.

Figure 6F:
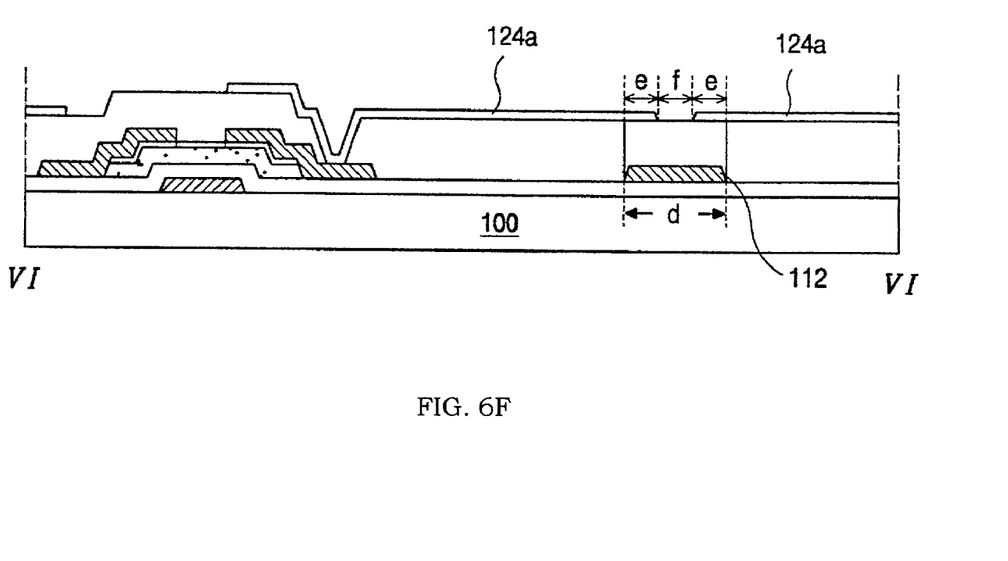

The metal layer 124, which is exposed through the removed photo-resist layer 126, is removed to form a pixel electrode 124a. Therefore, the pixel electrode 124a is formed as shown in FIG. 6F. If the above process is completely performed, the distance "f" between the pixel electrode 124a and the neighboring pixel electrode 124a can be formed to be under 3.5 µm. Referring to the related art, as the minimum space for the pixel electrodes not to electrically affect each other is 2 µm, the distance "f" between the pixel electrode 124a and the neighboring pixel electrode 124a is desirably 2 to 3.5 µm. The pixel electrode 124a is formed to overlap with both sides of the data line with an overlapping width "e" of 2 µm. The overlapping distance "e" may be formed under 2 µm.

Because it is impossible to reduce the width of the data line using the double slit mask in the present invention, the aperture ratio can be improved which improves the displaying quality of the liquid crystal display device. In addition, the effect of the present invention is maximized in a large-scaled liquid crystal display device.

It will be apparent to those skilled in the art that various modifications and variations can be made in the fabrication and application of the present invention without departing from the spirit or scope of the invention. Thus, it is intended that the present invention cover the modifications and variations thereof provided they come within the scope of the appended claims and their equivalents.

What is claimed is:

1. A manufacturing method of an array substrate for a liquid crystal display device, comprising:
    forming a gate line and a gate electrode on a substrate;
    forming a gate insulating layer on the substrate;
    forming an active layer and an ohmic contact layer on the gate insulating layer;
    forming a data line, a source electrode and a drain electrode on the substrate;
    forming a passivation layer by forming insulating material on the substrate;
    forming a drain contact hole by patterning the passivation layer, the drain contact hole exposing a part of the drain electrode;
    forming a transparent metal layer on the passivation layer;
    forming a photo-resist layer on the transparent metal layer;
    performing a light exposure process by disposing a mask over the photo-resist layer formed on the transparent metal layer, the mask including a light blocking portion, a slit portion and a light transmission portion, the slit portion corresponding to the data line; and
    forming a pixel electrode by developing the photo-resist layer exposed to light through the mask and etching the exposed transparent metal layer.

2. The method according to claim 1, wherein the light blocking portion of the mask corresponds to the pixel electrode, the light transmission portion of the mask corresponds to the active layer, the source electrode and the drain electrode and the slit portion corresponds to the data line.

3. The method according to claim 1, wherein a distance between the pixel electrode and a neighboring pixel electrode is 2 to 3.5 µm.

4. The method according to claim 1, wherein a width of the data line is 6 to 7.5 µm.

5. A method of manufacturing an array substrate for a liquid crystal display device, comprising:
    forming a gate line and a gate electrode on a substrate;
    forming a gate insulating layer on the substrate;
    forming an active layer and an ohmic contact layer on the gate insulating layer;
    forming a data line, a source electrode and a drain electrode on the substrate;
    forming a passivation layer by forming an insulating material on the substrate;
    forming a drain contact hole by patterning the passivation layer, the drain contact hole exposing a part of the drain electrode;
    forming a transparent metal layer on the passivation layer;
    forming a photo-resist layer on the transparent metal layer;
    performing a light exposure by disposing a mask over the photo-resist layer, the mask including a light blocking portion, a slit portion having at least two slits and a light transmission portion; and
    forming a pixel electrode by developing the photo-resist layer exposed to light and etching the exposed transparent metal layer.

6. The method according to claim 5, wherein a width of the slit is 1.2 µm.

7. The method according to claim 5, wherein a distance between the slit and the neighboring slit is 0.5 µm.

8. A manufacturing method of a thin film transistor array substrate for a display device, comprising:
    forming a plurality of gate lines and a plurality of gate electrodes on a substrate by depositing and etching a first conductive layer;
    forming a gate insulating layer on the substrate to cover the plurality of gate lines and the plurality of gate electrodes;
    forming a plurality of island-shaped active layers and a plurality of island-shaped ohmic contact layers on the gate insulating layer;
    forming a plurality of data lines, a plurality of source electrodes and a plurality of drain electrodes on the gate insulating layer, on the plurality of active layers and on the plurality of ohmic contact layers by depositing and etching a second conductive layer;
    forming a passivation layer having a plurality of contact holes for exposing at least one of the conductive layers by depositing and etching an insulating material on the gate insulating layer to cover the plurality of data lines, the plurality of source electrodes and the plurality of drain electrodes; and
    forming a plurality of pixel electrodes overlapping with the plurality of data lines and having a space less than 3.5 µm between at least two neighboring pixel electrodes on the passivation layer.

9. The method according to claim 8, wherein a distance between the pixel electrode and the neighboring pixel electrode is 2 to 3.5 µm.

10. The method according to claim 8, wherein a width of the data line is 6 to 7.5 µm.

11. The method according to claim 8, wherein the plurality of pixel electrodes is formed to utilize a mask including a light blocking portion, a slit portion and a light transmission portion.

12. The method according to claim 11, wherein the light blocking portion of the mask corresponds to the pixel electrode, the light transmission portion of the mask corresponds to the active layer, the source electrode and the drain electrode and the slit portion corresponds to the data line.

13. A method of manufacturing a thin film transistor array substrate for a display device, comprising:

forming a plurality of gate lines and a plurality of gate electrodes on a substrate by depositing and etching a first conductive layer;

forming a gate insulating layer on the substrate to cover the plurality of gate lines and the plurality of gate electrodes;

forming a plurality of island-shaped active layers and a plurality of island-shaped ohmic contact layers on the gate insulating layer;

forming a plurality of data lines, a plurality of source electrodes and a plurality of drain electrodes on the gate insulating layer, on the plurality of active layers and on the plurality of ohmic contact layers by depositing and etching a second conductive layer;

forming a passivation layer having a plurality of contact holes for exposing at least one of the conductive layers by depositing and etching an insulating material on the gate insulating layer to cover the plurality of data lines, the plurality of source electrodes and the plurality of drain electrodes; and forming a plurality of pixel electrodes overlapping with the plurality of data lines and having a space of less than 3.5 µm between at least two neighboring pixel electrodes on the passivation layer, and the plurality of pixel electrodes is formed to utilize a mask including a light blocking portion, a slit portion having at least two slits and a light transmission portion.

14. The method according to claim 13, wherein a width of the slit is 1.2 µm.

15. The method according to claim 13 wherein the distance between the slit and the neighboring slit is 0.5 µm.

16. The method according to claim 5, wherein the photoresist layer is formed on the transparent metal layer.

17. The method according to claim 5, wherein a distance between the pixel electrode and a neighboring pixel electrode is 2 to 3.5 µm.

18. The method according to claim 5, wherein an overlap between the pixel electrode and both sides of the data line is less than 2 µm.

* * * * *